United States Patent
Matsumura et al.

(10) Patent No.: US 7,208,059 B2
(45) Date of Patent: Apr. 24, 2007

(54) METHOD OF ULTRASONIC-MOUNTING ELECTRONIC COMPONENT AND ULTRASONIC MOUNTING MACHINE

(75) Inventors: Takayoshi Matsumura, Kawasaki (JP); Hidehiko Kira, Kawasaki (JP); Kenji Kobae, Kawasaki (JP); Norio Kainuma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/041,375

(22) Filed: Jan. 25, 2005

(65) Prior Publication Data
US 2006/0090833 A1 May 4, 2006

(30) Foreign Application Priority Data
Oct. 29, 2004 (JP) ............................ 2004-316537

(51) Int. Cl.
*B32B 37/00* (2006.01)

(52) U.S. Cl. ...................... 156/64; 156/73.1; 156/358; 156/580.1

(58) Field of Classification Search ............... 156/73.1, 156/308.2, 580.1, 580.2, 64, 358; 228/1.1, 228/110.1; 700/301
See application file for complete search history.

(56) References Cited

U.S. PATENT DOCUMENTS
2004/0211812 A1* 10/2004 Hizukuri et al. ............. 228/1.1

FOREIGN PATENT DOCUMENTS
JP  2002-217242  2/2002

* cited by examiner

*Primary Examiner*—James Sells
(74) *Attorney, Agent, or Firm*—Arent Fox LLP (57) ABSTRACT

The ultrasonic mounting method is capable of uniformly bonding bumps of an electronic component to a circuit board and improving reliability of ultrasonic-mounting the electronic component. The method comprises the step of applying ultrasonic vibrations to the electronic component so as to flip-chip-bond the electronic component to the circuit board having electrodes. The ultrasonic vibrations are applied in a direction parallel to a surface of the electronic component, and loads are vertically applied to the surface of the electronic component in conjunction with vibration cycles of the ultrasonic vibrations.

6 Claims, 5 Drawing Sheets

METHOD OF ULTRASONIC-MOUNTING ELECTRONIC COMPONENT AND ULTRASONIC MOUNTING MACHINE

BACKGROUND OF THE INVENTION

The present invention relates to a method of ultrasonic-mounting an electronic component and a ultrasonic mounting machine.

When a semiconductor chip, which is an example of the electronic component, is mounted on a circuit board by flip chip bonding, bumps of the semiconductor chip are headed for the circuit board, then the bumps, which are made of gold or solder, are respectively bonded to electrodes of the circuit board. A space between the semiconductor chip and the circuit board is filled with synthetic resin so as to protect a circuit face of the semiconductor chip, prevent the bumps from corrosion and improve bonding strength therebetween.

These days, the semiconductor chip is flip-chip-bonded by applying ultrasonic vibrations. By applying ultrasonic vibrations, bonding sections between the bumps and the electrodes are alloyed and bonded.

Figure 8:
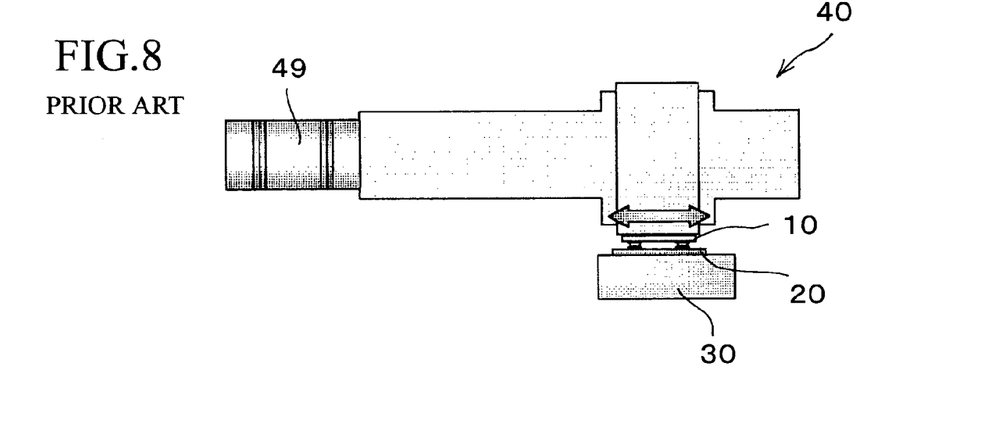
FIG. 8 is an explanation view of the conventional bonding tool.

A method of flip-chip-bonding a semiconductor chip by applying ultrasonic vibrations is shown in FIG. 8. The semiconductor chip 10 is air-sucked and held by a boding tool 40 and corresponded to a circuit board 20 supported by a supporting stage 30. Ultrasonic vibrations, which are generated by an ultrasonic transducer 49 attached to an end of the bonding tool 40, are applied to the semiconductor chip 10, so that the semiconductor chip 10 can be bonded to the circuit board 20.

Figure 9:
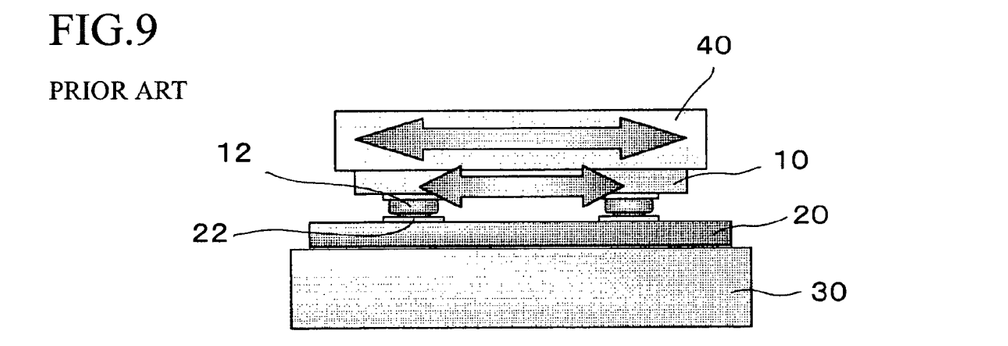
FIG. 9 is an explanation view showing the conventional method of ultrasonic-mounting the semiconductor chip.

FIG. 9 is an enlarged view of bonding the semiconductor chip 10 to the circuit board 20 by applying ultrasonic vibrations to the semiconductor chip 10. Ultrasonic vibrations are applied in a direction parallel to a surface of the semiconductor chip 10, so that the semiconductor chip 10 is horizontally vibrated with respect to the circuit board 20 supported by the supporting stage 30. By vibrating the semiconductor chip 10, bumps 12 of the semiconductor chip 10 and electrodes of the circuit board 20 are mutually grinded, so that they are bonded each other.

Generally, the semiconductor chip 10 is vibrated in a direction parallel to the surface thereof, but the semiconductor chip may be vertically vibrated with respect to the surface thereof (see Japanese Patent Gazette No. 2001-57376).

Applied energy for ultrasonic bonding is generally indicated by the following formula:

$$E = \int_0^{r_0} \mu L \cdot 2\pi f A \sin(2\pi f t) dt$$

wherein E ($\mu$J/m2) is the applied energy, $\mu$ is a frictional coefficient between the bumps and pads, L (Pa) is a load, f (Hz) is frequency, A ($\mu$m) is amplitude, and t (sec.) is time. According to the formula, the applied energy for bonding is increased with increasing the load.

Figures 10A, 10B, 11:
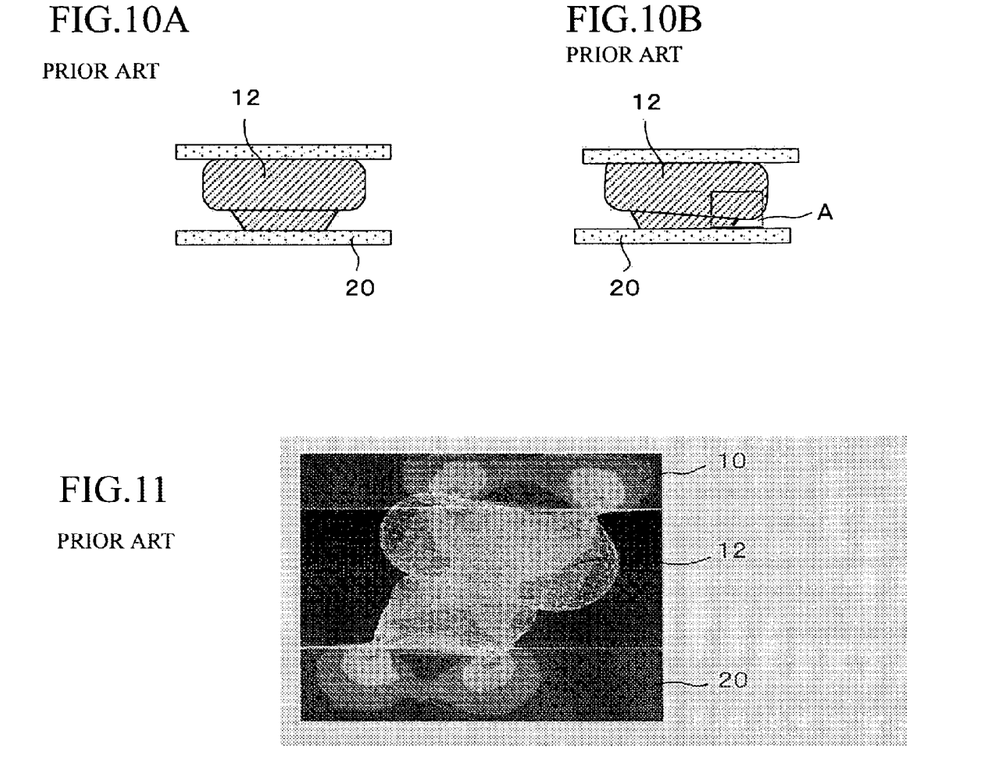
FIGS. 10A and 10B are explanation views showing action of the bump, to which ultrasonic vibrations are applied.
FIG. 11 is an explanation view showing a result of simulation of working stress on the bump bonded by the conventional method.

FIGS. 10A and 10B explain action of the bump 12 when ultrasonic vibrations are applied to the semiconductor chip 10 in the direction parallel to the surface thereof. In FIG. 10A, displacement of the bump 12 in the direction of the vibrations is zero; in FIG. 10B, the displacement of the bump 12 in the direction of the vibrations is maximized. When ultrasonic vibrations are applied to the semiconductor chip 10, the bump 12 is slightly inclined rightward and leftward. At that time, stress working on the bump 12 concentrates to an outer circumferential part A of the bump 12.

FIG. 11 shows a result of simulation of working the stress on the bump 12 bonded by applying ultrasonic vibrations. According to FIG. 11, the stress concentrates to the outer circumferential part when the displacement of the bump 12 is maximized.

Figure 12:
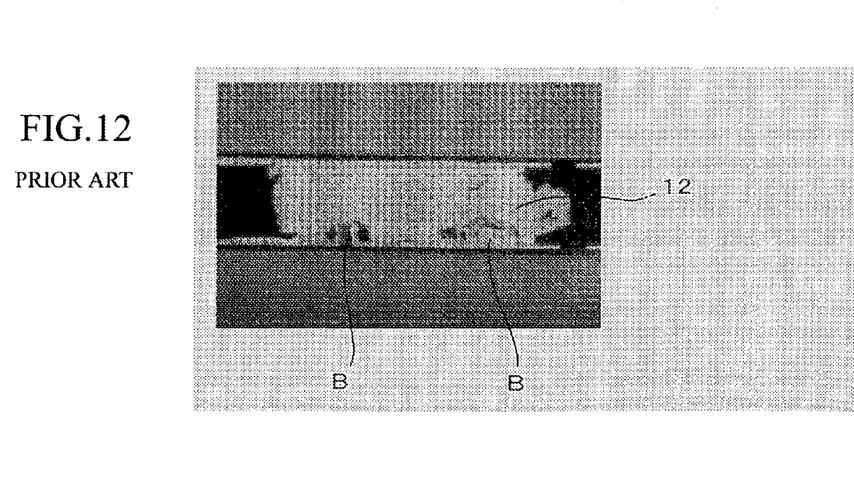
FIG. 12 is an electron micrograph showing an inner structure of the bump bonded by the conventional method.

When the displacement of the bump 12 is maximized, the stress concentrates to the outer circumferential part of the bump 12 so that metal bonding in the outer circumferential part is promoted, but metal bonding in a center part of the bump 12 is insufficient. Thus, in a contact area of the bump 12 and the electrode 22, the both cannot bonded uniformly. Further, voids are formed in a bonding section of the bump 12, so that bonding strength or bonding reliability must be lowered. In FIG. 12, voids B are formed close to the outer circumferential part of the bump 12.

Note that, in the method of vertically applying ultrasonic vibrations to the electronic component, if the electronic component is mounted onto a relatively soft substrate, e.g., plastic substrate, it is difficult to correctly apply energy to a bonding section, so that the electronic component cannot be mounted with prescribed bonding strength.

SUMMARY OF THE INVENTION

The present invention has been invented to solve the problems of the conventional technology.

An object of the present invention is to provide a method of ultrasonic-mounting an electronic component, which is capable of uniformly bonding bumps of the electronic component to a circuit board and improving reliability of ultrasonic-mounting the electronic component.

Another object is to provide a ultrasonic mounting machine, which is capable of executing the method of the present invention.

To achieve the objects, the present invention has following structures. Namely, the method of ultrasonic-mounting an electronic component on a circuit board comprises the step of applying ultrasonic vibrations to the electronic component so as to flip-chip-bond the electronic component to the circuit board having electrodes, wherein the ultrasonic vibrations are applied in a direction parallel to a surface of the electronic component, and loads are vertically applied to the surface of the electronic component in conjunction with vibration cycles of the ultrasonic vibrations. Note that, the loads are applied to the s electronic component in conjunction with the vibration cycles of the ultrasonic vibrations, so the loads are not applied without reference to the vibration cycles of the ultrasonic vibrations. Normally, the loads are periodically applied in conjunction with the vibration cycles of the ultrasonic vibrations. The word "periodically" means, for example, periodic-functionally applying the loads, and intermittently periodically applying the loads.

In the method, the loads may be maximized at first positions, at each of which displacement of the electronic component in the direction of the vibrations is zero, and the loads may be minimized at second positions, at each of which displacement of the electronic component in the direction of the vibrations is maximum. With this method, bondability of bonding sections between the electronic component and the circuit board can be improved, so that the both can be securely flip-chip-bonded. Note that, the effect can be sufficiently gained when the displacement of the electronic component is not only zero and the maximum but also near zero and near maximum.

In the method, the loads may be periodic-functionally varied as vibrations between each time point of applying the maximum load and each time point of applying the minimum load. With this method, the loads can be applied and varied between the electronic component and the circuit board without difficulty, so that the electronic component can be securely flip-chip-bonded.

For example, frequency of the vibrations of the loads is twice as high as that of the ultrasonic vibrations. In this case, the loads can be well applied to the bumps when no stress works on center parts of bumps of the electronic component, so that the bumps can be well bonded. On the other hand, when stress concentrates to outer circumferential parts of the bumps, the stress working on the bumps are relieved, so that exceedingly concentrating stress to the outer circumferential parts of the bumps can be prevented. Therefore, bonding sections between the electronic component and the circuit board can be bonded uniformly.

In the method, the loads may be applied like pulses at time points of applying maximum loads only. With this method, bondability of bonding sections between the electronic component and the circuit board can be improved.

The ultrasonic mounting machine of the present invention comprises: a supporting stage supporting a circuit board having electrodes; and a bonding tool applying ultrasonic vibrations to a surface of an electronic component in a direction parallel to the surface so as to flip-chip-bond the electronic component to the circuit board, wherein said bonding tool includes a ultrasonic transducer applying ultrasonic vibrations to the surface of the electronic component in the direction parallel to the surface, and a vibrating mechanism vertically applying loads to the surface of the electronic component, and a control mechanism controls the ultrasonic transducer and the vibrating mechanism, the control mechanism applies the loads to the electronic component in conjunction with vibration cycles of the ultrasonic transducer.

In the ultrasonic mounting machine, the control mechanism may control the vibrating mechanism so as to maximize the loads at first positions, at each of which displacement of the electronic component in the direction of the vibrations is zero, and minimize the loads at second positions, at each of which displacement of the electronic component in the direction of the vibrations is maximum.

In the ultrasonic mounting machine, the control mechanism may control the vibrating mechanism so as to periodic-functionally vary the loads as vibrations between each time point of applying the maximum load and each time point of applying the minimum load.

In the ultrasonic mounting machine, the vibrating mechanism may have a vibrating section including a piezo element provided to the bonding tool, and the vibrating mechanism may be provided to the supporting table, in which the loads are vertically applied to a surface of the circuit board. The vibrating section may include a ultrasonic transducer, etc.

In the method and the machine of the present invention, the ultrasonic vibrations are applied to the electronic component in the direction parallel to the surface thereof, and the loads are vertically applied to the surface of the electronic component. Therefore, the electronic component can be securely mounted onto the circuit board by controlling the ultrasonic vibrations and the loads.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Figure 1:
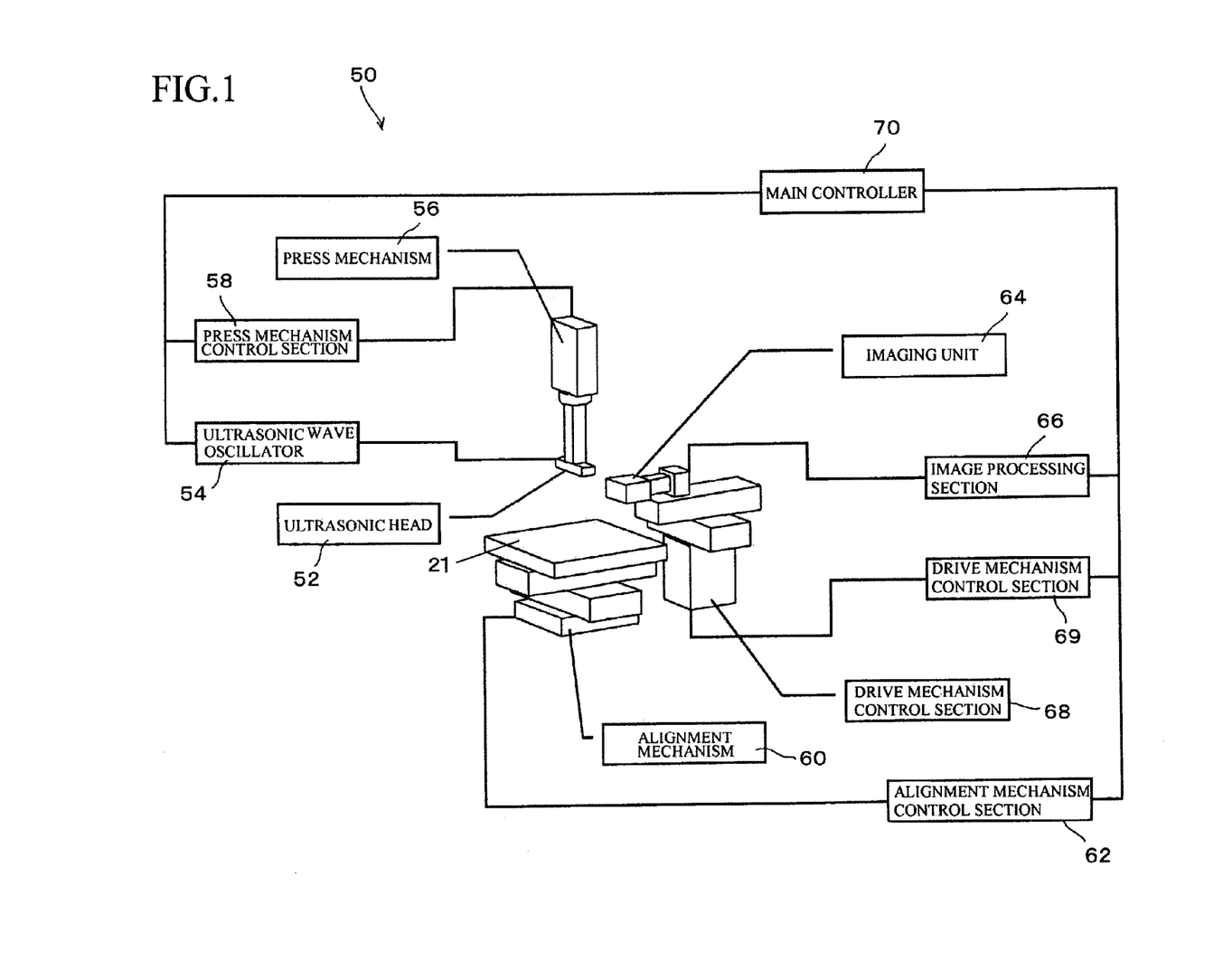
FIG. 1 is an explanation view of a ultrasonic mounting machine for flip-chip-bonding a semiconductor chip by the method of the present invention.

FIG. 1 shows a mounting machine 50 for flip-chip-bonding a semiconductor chip 10, which is an example of the electronic component, onto a circuit board 20.

The mounting machine 50 mainly comprises a ultrasonic head side and a supporting table side. The ultrasonic head side includes: a ultrasonic head 52 air-sucking and holding the semiconductor chip 10; a ultrasonic wave oscillator 54 applying ultrasonic vibrations to the ultrasonic head 52; a press mechanism 56 pressing the semiconductor chip 10 toward the circuit board 10; and a press mechanism control section 58 controlling a load of the press mechanism 56.

On the other hand, the supporting table side includes: an alignment mechanism 60 positioning and moving a supporting table 21 in X- Y- and θ-directions; and an alignment mechanism control section 62 controlling the alignment mechanism 60 so as to adjust mutual positions of the semiconductor chip 110 and the circuit board 20 and correctly flip-chip-bond the semiconductor chip 10 to the circuit board 20. Further, the supporting table side includes: an imaging unit 64, which acts as a detecting mechanism, detecting the mutual positions of the semiconductor chip 10 and the circuit board 20; an image processing section 66 processing image data sent from the imaging unit 64; a drive mechanism 68 moving the imaging unit 64; and a drive mechanism control section 69 controlling the drive mechanism 68 so as to move the imaging unit 64 to a prescribed position.

A main controller 70 controls the alignment mechanism control section 62, on the basis of results detected by the image processing section 66, so as to correctly position the semiconductor chip 10 and the circuit board 20. Then, the main controller 70 controls the press mechanism control section 58 and the ultrasonic wave oscillator 54, so that the semiconductor chip 10 can be flip-chip-bonded or mounted on the circuit board 20 with a suitable load.

(Ultrasonic Bonding Method)

FIGS. 2A–2D are explanation views showing the method of ultrasonic-bonging the semiconductor chip 10 to the circuit board 20, wherein motion of a bump 12 of the semiconductor chip 10 with respect to one vibration cycle is shown.

Figure 2A:
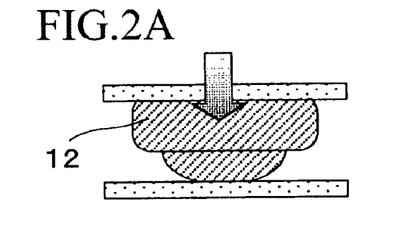
FIGS. 2A–2D are explanation views showing an embodiment of the method of the present invention.
Figure 2B:
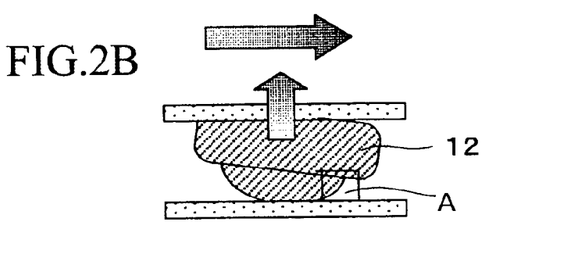
Figure 2C:
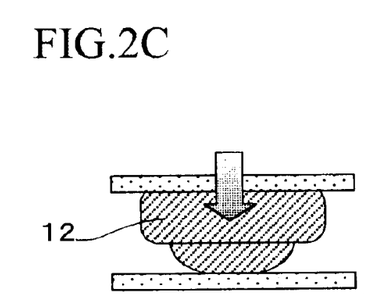
Figure 2D:
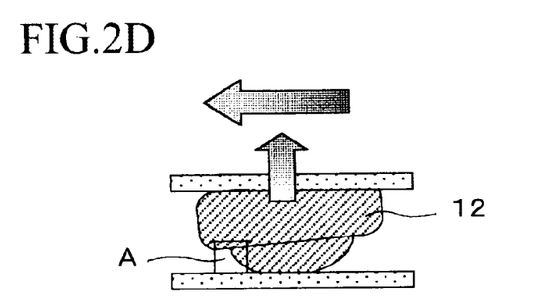

In FIG. 2A, displacement of the semiconductor chip 10 in the direction of ultrasonic vibrations is zero; in FIG. 2B, the displacement to one side is maximized; in FIG. 2C, the semiconductor chip 10 returned and the displacement becomes zero again; and in FIG. 2D, the displacement to the other side is maximized. The semiconductor chip 10 is returned from the state shown in FIG. 2D to the state shown in FIG. 2A to complete one cycle of the vibrations, then the next cycle of the vibrations begins.

As described above, by applying ultrasonic vibrations to the semiconductor chip 10 in the direction parallel to the surface thereof, the bumps 12 incline when the displacement is maximized (see FIGS. 2B and 2D), so that stress concentrate to the outer circumferential part A (see FIG. 10B) of each of the bumps 12.

When frequency and amplitude of ultrasonic vibrations are fixed, the energy for ultrasonic mounting in increased with increasing load. Thus, the present embodiment is characterized in that the loads applied to the bumps 12 is increased and reduced in conjunction with the ultrasonic vibrations, which are horizontally applied to the semiconductor chip 10, so as to bond the semiconductor chip 10 to the circuit board 20.

The loads applied to the bumps 12 press the semiconductor chip 10 toward the circuit board 20. In other words, the loads are increased when a distance between the semiconductor chip 10 and the circuit board 20 is shortened; the loads are reduced when the distance therebetween is lengthened. Namely, by vertically applying vibrations to the surface of the semiconductor chip 10, the loads applied to the bumps 12 can be controlled.

In FIGS. 2A–2D, the horizontal vibrations and the vertical vibrations applied to the semiconductor chip 10 are indicated by arrows.

In FIG. 2A, a displacement of the bump 12 in the direction of the ultrasonic vibrations is zero, and no stress concentrates to the outer circumferential part. The distance between the semiconductor chip 10 and the circuit board 20 is shortened so as to increase the load applied to the bump 12.

In FIG. 2B, the displacement of the bump 12 to the one side is maximized, and the stress is concentrated to the outer circumferential part A. The distance between the semiconductor chip 10 and the circuit board 20 is lengthened so as to reduce the load applied to the bump 12.

In FIG. 2C, the displacement of the bump 12 in the direction of the ultrasonic vibrations is zero, and no stress concentrates to the outer circumferential part. The distance between the semiconductor chip 10 and the circuit board 20 is shortened so as to increase the load applied to the bump 12.

In FIG. 2D, the displacement of the bump 12 to the other side is maximized, and the stress is concentrated to the outer circumferential part A. The distance between the semiconductor chip 10 and the circuit board 20 is lengthened so as to reduce the load applied to the bump 12.

After the state shown in FIG. 2D, the state of the bump 12 is returned to the state shown in FIG. 2A. With this action, one cycle of the horizontal ultrasonic vibrations applied to the semiconductor chip 10 completes. When the semiconductor chip 10 is mounted onto the circuit board 20, many cycles of the ultrasonic vibrations are applied to the semiconductor chip 10. In the present embodiment, the loads are controlled, as shown in FIGS. 2A–2D, for each cycle of the ultrasonic vibrations. By combining the horizontal and vertical actions of the semiconductor chip 10, the semiconductor chip 10 can be bonded to the circuit board 20.

In the present embodiment, when no stress concentrates to the outer circumferential parts of the bumps 12, the loads applied to the bumps 12 are increased so as to increase stress concentrating the center parts thereof, so that bondability of the center parts can be ensured. On the other hand, when the stress concentrates to the outer circumferential parts A of the bumps 12, the loads applied to the bumps 12 are reduced so as not to increase stress concentrating the circumferential parts A thereof, so that exceeding concentration of the stress to the circumferential parts A can be prevented. With this control, the semiconductor chip 10 can be securely mounted on the circuit board 20.

The loads applied to the bumps 12 are periodic-functionally varied as vibrations between each time point of applying the maximum load, at which the displacement of the semiconductor chip 10 in the direction of the ultrasonic vibrations is zero, and each time point of applying the minimum load, at which the displacement is maximized. In this case, frequency of the vibrations of the loads is, for example, twice as high as that of the ultrasonic vibrations.

Further, the loads applied to the bums 12 may be applied like pulses at time points of applying maximum loads only. At that time, the pulse-loads may be added to average loads.

Conventionally, the stress working to the center parts of the bumps are small, so that bondability of the bumps must be lowered. Further, the stress concentrates to the outer circumferential parts of the bumps, so that voids are formed in the outer circumferential parts. However, in the present embodiment, the problems of the low bondability and forming voids can be prevented. Further, all the bonding sections between the bumps 12 and the electrodes 22 can be bonded with uniform bondability. Namely, by employing the method of the present embodiment, the bondability of the bonding sections between the bumps 12 and the electrodes 22 can be improved, and bad bonding therebetween can be solved, so that the semiconductor chip 10 can be securely mounted on the circuit board 20.

(Bonding Tool)

Figure 3:
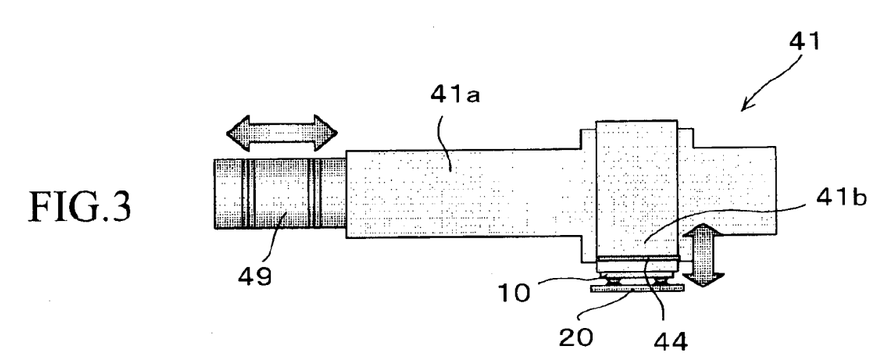
FIG. 3 is an explanation view of a bonding tool.
Figure 4:
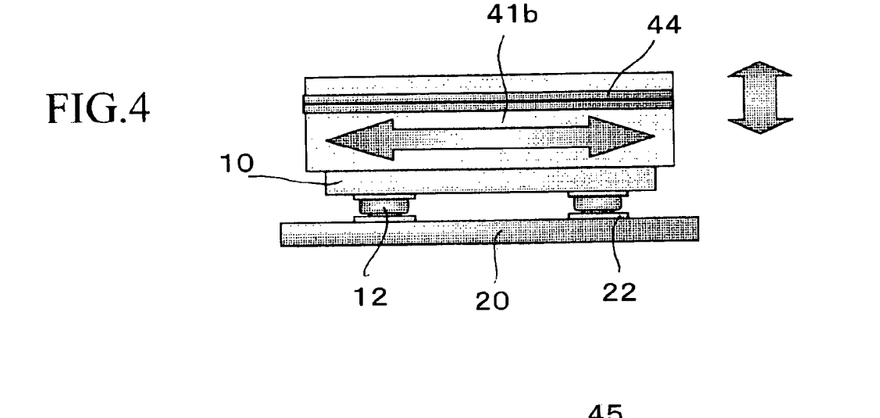
FIG. 4 is an explanation view showing function of the bonding tool.

A bonding tool, which horizontally applies the ultrasonic vibrations to the semiconductor chip 10 and vertically applies loads thereto so as to bond the semiconductor chip 10 to the circuit board 20, is shown in FIGS. 3 and 4.

As shown in FIG. 3, the bonding tool 41 has a tool proper 41a, a sucking section 41b for sucking and holding the semiconductor chip 10, and a vibrating section 44 provided to the sucking section 41b. The vibrating section 44 includes a piezo element and is capable of vertically applying loads to the semiconductor chip 10. A ultrasonic transducer 49 is provided to an end of the bonding tool 41. A vibrating direction of the vibrating section 44 provided to the sucking section 41b is perpendicular to the longitudinal direction of the tool proper 41a.

FIG. 4 is a partial enlarged view of the bonding tool 41, in which the vibrating section 44 including the piezo element is shown. The vibrating section 44 including the piezo element is vertically vibrated, so that the horizontal ultrasonic vibrations and the vertical vibrations are applied to the semiconductor chip 10 held by the sucking section 41b.

The main controller 70 of the ultrasonic mounting machine 50 controls the press mechanism control section 58, the press mechanism 56, etc. so as to control the bonding tool 41, the ultrasonic transducer 49 and the vibrating section 44. Frequencies, amplitudes and phases of the ultrasonic transducer 49 and the vibrating section 44 are controlled. By controlling the phases of the horizontal vibrations by the ultrasonic transducer 49 and the vertical vibrations by the vibrating section 44, the horizontal ultrasonic vibrations and the vertical vibrations can be applied to the semiconductor chip 10, so that the semiconductor chip 10 can be securely mounted on the circuit board 20.

Figure 5:
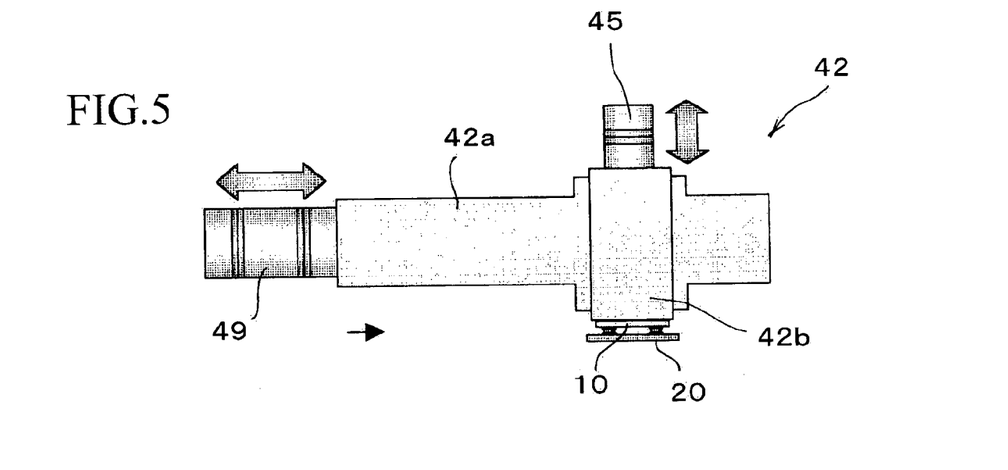
FIG. 5 is an explanation view of the bonding tool.
Figure 6:
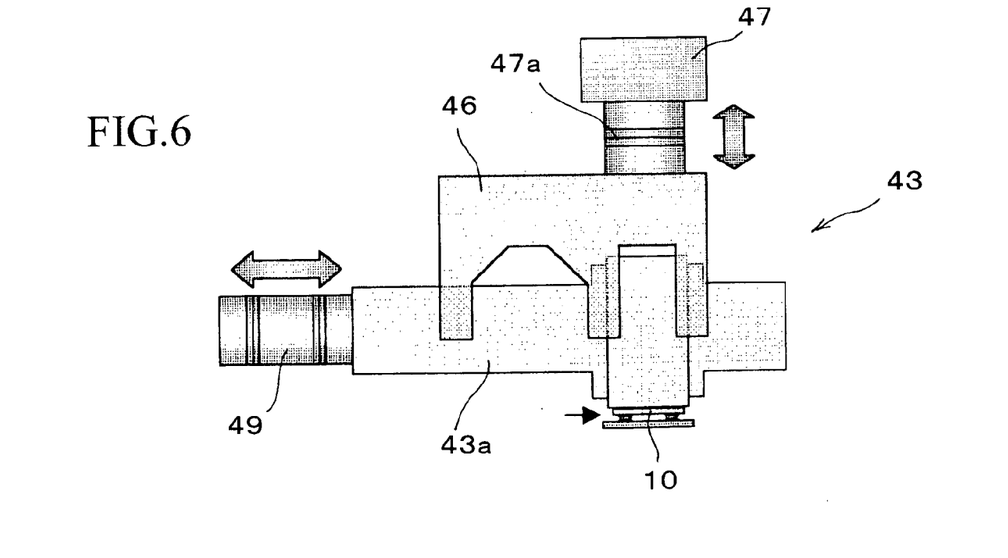
FIG. 6 is an explanation view of the bonding tool.
Figure 7:
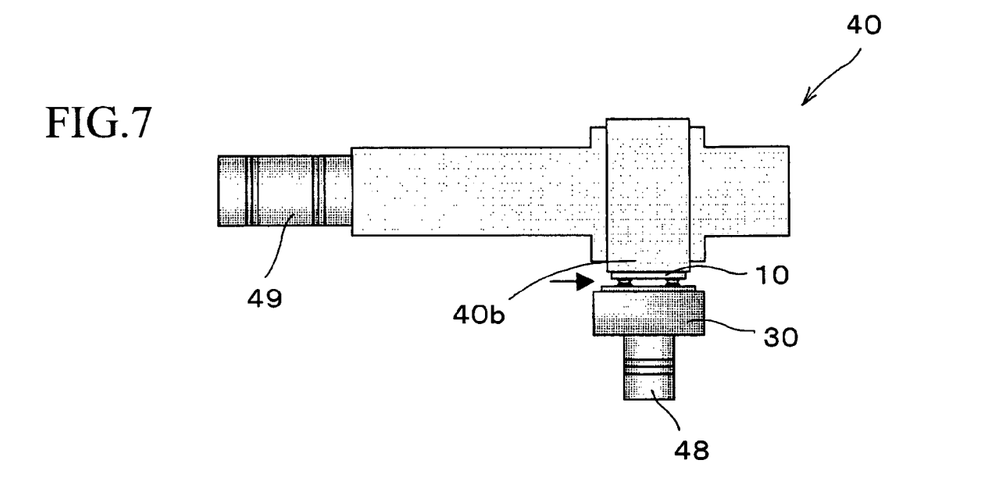
FIG. 7 is an explanation view of a supporting stage, to which a ultrasonic transducer is attached.

Other examples of the bonding tool for ultrasonic mounting are shown in FIGS. 5–7.

In FIG. 5, a bonding tool 42 has a tool proper 42a and a sucking section 42b for sucking and holding the semiconductor chip 10. Further, a ultrasonic transducer 45 constituting the vibrating section is provided on the opposite side of the sucking section 42b. A vibrating direction of the ultrasonic transducer 45 is perpendicular to the longitudinal direction of the tool proper 41a.

Frequencies, amplitudes and phases of the ultrasonic vibrations applied by the ultrasonic transducers 45 and 49 can be suitably controlled by respectively controlling the ultrasonic transducers 45 and 49. The horizontal vibrations by the ultrasonic transducer 49 and the vertical vibrations by the ultrasonic transducer 45 cooperate to vibrate the semiconductor chip 10 held by the sucking section 42b, so that the semiconductor chip 10 can be securely mounted on the circuit board 20.

In FIG. 6, a bonding tool 43 has a tool proper 43a, which is pressed by the press mechanism 56. A ultrasonic transducer 47a, which applies vertical vibrations to the semiconductor chip 10, is assembled in the press mechanism 56.

In the bonding tool 43, the tool proper 43a is suspended by a holder 46, and the ultrasonic transducer 47a is held between the holder 46 and the press mechanism 56 by an adapter 47. With this structure, the tool proper 43a can be attached to the press mechanism 56. Note that, the holder 46, the adapter 47 and the ultrasonic transducer 47a constitute the vibrating section.

In case of mounting the semiconductor chip 10 by the bonding tool 43 too, the horizontal vibrations are applied to the semiconductor chip 10 by the ultrasonic transducer 49, and the vertical vibrations are applied to the semiconductor chip 10 by the ultrasonic transducer 47a. Therefore, the horizontal vibrations and the vertical vibrations can be applied to the semiconductor chip 10, so that the semiconductor chip 10 can be securely mounted on the circuit board 20. Note that, the holder 46 can stably hold the tool proper 43a during the ultrasonic mounting.

In FIG. 7, the bonding tool 40 has the conventional mechanism for horizontally vibrating the semiconductor chip 10. Further, a ultrasonic transducer 48, which vertically applies vibrations to the surface of the circuit board 20 as the vibrating section, is assembled in a supporting stage 30, which supports the circuit board 20.

By applying the vertical vibrations to the circuit board 30 via the supporting stage 30, the loads vertically working to the bumps 12 of the semiconductor chip 10 can be varied. Therefore, frequencies, amplitudes and phases of the horizontal ultrasonic vibrations, which are applied to the bonding tool 40 by the ultrasonic transducer 49, and the vertical ultrasonic vibrations, which are applied to the circuit board 20 by the ultrasonic transducer 48, are suitably controlled, so that the horizontal vibrations and the vertical vibrations cooperate to vibrate the semiconductor chip 10 and the semiconductor chip 10 can be securely mounted on the circuit board 20.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of ultrasonic-mounting an electronic component on a circuit board comprising the step of:

applying ultrasonic vibrations to the electronic component, so as to flip-chip-bond the electronic component to the circuit board having electrodes, in a direction parallel to a surface of the electronic component, applying loads vertically to the surface of the electronic component in conjunction with vibration cycles of the ultrasonic vibrations, applying maximum loads at first positions where displacement of the electronic component in the direction of the vibrations is zero, and applying minimum loads at second positions where displacement of the electronic component in the direction of the vibrations is maximum.

2. The method according to claim 1, wherein the loads are periodic-functionally varied as vibrations between each time point of applying the maximum load and each time point of applying the minimum load.

3. The method according to claim 2, wherein frequency of the vibrations of the loads is twice as high as that of the ultrasonic vibrations.

4. A method of ultrasonic-mounting an electronic component on a circuit board comprising the step of:

applying ultrasonic vibrations to the electronic component so as to flip-chip-bond the electronic component to the circuit board having electrodes, the ultrasonic vibrations being applied in a direction parallel to a surface of the electronic component, vertically applying loads to the surface of the electronic component in conjunction with vibration cycles of the ultrasonic vibrations, and applying the loads like pulses at time points of applying maximum loads only.

5. A ultrasonic mounting machine, comprising:

a supporting stage supporting a circuit board having electrodes; and a bonding tool applying ultrasonic vibrations to a surface of an electronic component in a direction parallel to the surface so as to flip-chip-bond the electronic component to the circuit board, wherein said bonding tool includes a ultrasonic transducer applying ultrasonic vibrations to the surface of the electronic component in the direction parallel to the surface, and a vibrating mechanism vertically applying loads to the surface of the electronic component, a control mechanism controls the ultrasonic transducer and the vibrating mechanism, the control mechanism applies the loads to the electronic component in conjunction with vibration cycles of the ultrasonic transducer, and the control mechanism controls the vibrating mechanism so as to maximize the loads at first positions where displacement of the electronic component in the direction of the vibrations is zero, and minimize the loads at second positions where displacement of the electronic component in the direction of the vibrations is maximum.

6. The ultrasonic mounting machine according to claim 5, wherein the control mechanism controls the vibrating mechanism so as to periodic-functionally vary the loads as vibrations between each time point of applying the maximum load and each time point of applying the minimum load.

* * * * *